United States Patent
Novac et al.

(10) Patent No.: US 6,930,917 B2
(45) Date of Patent: Aug. 16, 2005

(54) PROGRAMMING AN ELECTRONIC DEVICE INCLUDING A NON-VOLATILE MEMORY, IN PARTICULAR FOR ADJUSTING THE FEATURES OF AN OSCILLATOR

(75) Inventors: Pinchas Novac, Neuchâtel (CH); Yves Sierro, Diesse (CH); Silvio Dalla Piazza, St-Imier (CH)

(73) Assignee: EM Microelectronic-Marin SA, Marin (CH)

(*) Notice: Subject to any disclaimer, the term of this patent is extended or adjusted under 35 U.S.C. 154(b) by 87 days.

(21) Appl. No.: 10/485,465

(22) PCT Filed: Jul. 29, 2002

(86) PCT No.: PCT/EP02/08430

§ 371 (c)(1),
(2), (4) Date: Feb. 2, 2004

(87) PCT Pub. No.: WO03/017284

PCT Pub. Date: Feb. 27, 2003

(65) Prior Publication Data

US 2004/0233739 A1 Nov. 25, 2004

(30) Foreign Application Priority Data

Aug. 13, 2001 (EP) .......................................... 01203053

(51) Int. Cl.[7] .............................................. G11C 16/04
(52) U.S. Cl. .................................. 365/185.05; 365/221
(58) Field of Search ............................. 365/185.05, 221

(56) References Cited

U.S. PATENT DOCUMENTS

| 4,763,309 A | 8/1988 | Descombes |
| 5,488,711 A | 1/1996 | Hewitt et al. |
| 5,587,653 A | 12/1996 | Araki |
| 5,629,898 A * | 5/1997 | Idei et al. .................... 365/222 |
| 5,949,291 A | 9/1999 | Newland |
| 5,952,890 A | 9/1999 | Fallisgaard et al. |
| 5,963,463 A | 10/1999 | Rondeau, II et al. |
| 6,201,733 B1 * | 3/2001 | Hiraki et al. .......... 365/185.08 |
| 6,735,726 B2 * | 5/2004 | Muranaka et al. .......... 365/201 |

FOREIGN PATENT DOCUMENTS

EP    1111770 A1    12/1999

* cited by examiner

Primary Examiner—Michael S. Lebentritt
Assistant Examiner—Tuan T. Nguyen
(74) Attorney, Agent, or Firm—Sughrue Mion, PLLC

(57) ABSTRACT

An electronic device including an electronic circuit (1, 8) for delivering an output signal (CKS) and a programmable non volatile memory (30) coupled to the electronic circuit to allow storage of a binary word (EED[7:0]) representative of at least one adjustable feature ($C_1$, $C_2$) of the electronic circuit (1, 8), this electronic device including at least first and second supply terminals (PAD_VDD, PAD_VSS), to which first and second supply voltages are applied ($V_{DD}$, $V_{SS}$) and at least one output terminal (PAD_OUT) at which the output signal from the electronic circuit is delivered. Circuits are provided for switching the output terminal into a so-called high impedance state so as to allow the introduction, in serial form, via this output terminal, of data bits intended, in particular, to be stored in the non volatile memory of the device. This device is applied, in particular, for adjusting the features of an oscillator circuit.

12 Claims, 10 Drawing Sheets

PROGRAMMING AN ELECTRONIC DEVICE INCLUDING A NON-VOLATILE MEMORY, IN PARTICULAR FOR ADJUSTING THE FEATURES OF AN OSCILLATOR

The present invention concerns generally the programming of an electronic device including a memory. More particularly, the present invention concerns the programming of a memory for adjusting the features of an oscillator.

It is now common to fit electronic devices with a non-volatile memory for the purpose of adjusting certain operating features of the electronic device. It is for example already known to program a memory of an electronic device including a time base and a frequency divider circuit in order to store a binary word representative, for example, of the division rate of the frequency divider circuit.

By way of example, Swiss Patent document CH 664 868 discloses a programming device of a non-volatile memory for a timepiece by means of which the division rate of the frequency divider circuit is adjusted by introducing into the memory a number representative of the difference in frequency between the time base frequency and a standard frequency. According to this document, programming is advantageously carried out via two supply terminals to which the timepiece battery is normally connected.

This solution has the advantage of not requiring any additional terminals to program the non-volatile memory. The use of the supply terminals of the device to program the memory has, however, a drawback in the sense that the supply voltage of the electronic device and the voltage levels necessary for programming typically have to be fixed at predetermined levels. Moreover, the use of the supply terminals as programming terminals means that the electronic device has to be designed such that the components normally powered are not disturbed when data is introduced. Yet another drawback of this solution also lies in the fact that the powering of the electronic device typically has to be interrupted to access the supply terminals.

One object of the present invention is to propose a solution for programming a non-volatile memory of an electronic device, which does not require the use of the device's supply terminals.

Another object of the present invention is to propose a solution preferably using existing terminals of the electronic device to carry out programming of the non-volatile memory.

More particularly, the object of the present invention is to propose such a solution allowing the features of an oscillator circuit to be adjusted.

The present invention thus concerns an electronic device including a programmable non-volatile memory whose features are listed in independent claim 1.

The present invention also concerns a method for programming and/or reading a programmable non-volatile memory of an electronic device whose features are listed in independent claim 10.

Advantageous embodiments of the present invention form the subject of the independent claims.

In particular, the present invention concerns more particular an electronic device including an oscillator circuit having an adjustable feature.

One advantage of the present invention lies in the fact that, in addition to the two supply terminals of the device and an output terminal through which an output signal of the device is delivered, it requires only one control terminal, accessible from the exterior, i.e. a minimum of four external terminals. This constitutes a very significant advantage, in particular during assembly and packaging of an electronic device of reduced size, such as an integrated electronic component, like an oscillator circuit, for example. In particular, the reduced number of required terminals only involves limited bonding and connecting operations between the terminals of the integrated circuit itself and the connection terminals of the package in which the integrated circuit is packaged.

Within the scope of a specific application to an oscillator circuit, the present invention allows, in particular, a component of very compact size to be made, whose features it is possible to adjust.

Other features and advantages of the present invention will appear more clearly upon reading the following detailed description, made with reference to the annexed drawings, given by way of non limiting example, and in which.

In the following part of the present description, an embodiment example of an oscillator circuit incorporating the solution according to the present invention, will now be described. "Oscillator circuit" means an electronic circuit delivering an alternating output signal or oscillating signal at at least one frequency and including at least one resonant element and an electronic supply and maintenance circuit for the vibrations of the resonant element. Various types of oscillator circuits are already known from the prior art. By way of information, one could for example refer to European Patent Application No. EP 1 111 770 A1 (incorporated herein by reference) which discloses a low frequency quartz oscillator device having improved thermal behaviour. This oscillator device employs a quartz resonator able to vibrate at least according to a fundamental torsional vibration mode and an inverter type vibration maintenance circuit arranged to maintain the resonator vibrations according to the torsional vibration mode.

Figure 1:
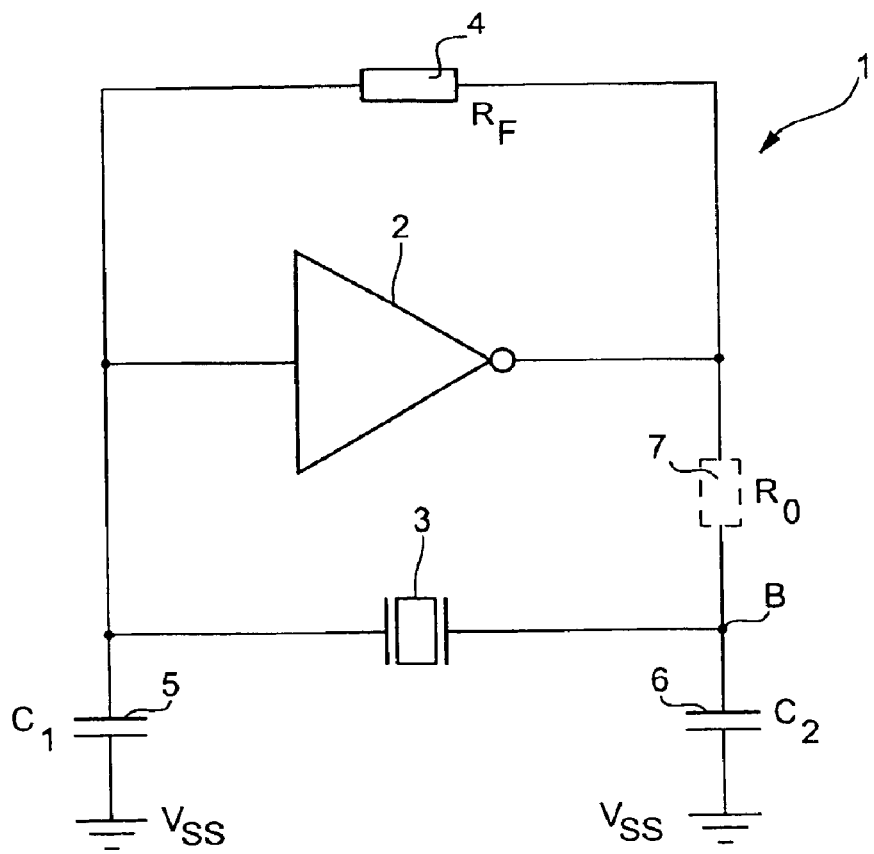
FIG. 1 is a diagram of an inverter type oscillator circuit having, in particular, first and second load capacitors placed at the input and output of the inverter.

FIG. 1 is a schematic diagram of the oscillator device of the aforementioned Application. This oscillator device, globally indicated by the reference numeral 1, essentially includes the parallel arrangement, between input terminal A and output terminal B, of a so-called feedback resistive element 4, of resistance value $R_F$, an inverter amplifier means 2, and a resonator 3, here a quartz resonator. First and second load capacitors 5 and 6, of capacitance value $C_1$ and $C_2$, are respectively connected between input terminal A and output terminal B, on the one hand, and a circuit supply potential, on the other hand, such as a low potential $V_{SS}$ forming ground (these load capacitors 5 and 6 may alternatively be connected to a high potential $V_{DD}$). By way of option, an additional resistive element 7, of resistance value $R_0$, can be connected in series between the output of amplifier means 2 and resonator 3 as illustrated, in order to improve the oscillator circuit's stability.

Figure 2:
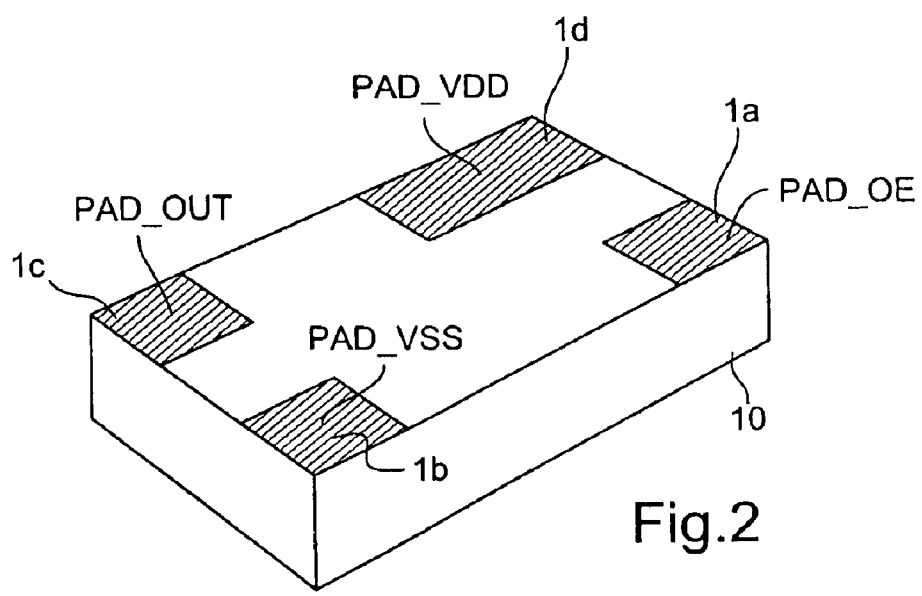
FIG. 2 is a schematic perspective view of the lower face of an SMD electronic component, such as an oscillator circuit, including only four connection terminals, namely two supply terminals, a control terminal and an output terminal.

The oscillator device of FIG. 1 may advantageously be incorporated with its resonator in a single package of reduced size (for example a ceramic package of the order of several mm$^2$). FIG. 2 shows a schematic perspective view of the lower face of an SMD (Surface Mounted Device) type electronic device including such a package 10 intended to incorporate the oscillator device of FIG. 1. The device mounted in its SMD package only includes, in this example, four connection terminals 1a, 1b, 1c and 1d, namely two supply terminals 1d and 1b (respectively designated PAD_VDD and PAD_VSS in the following description), a control terminal 1a (designated PAD_OE) and an output terminal 1c (designated PAD_OUT).

As already mentioned in the preamble of the present description, it is desirable to be able to adjust certain features of the electronic device, in particular at the end of the assembly and packaging of the electronic component. In this case, it is for example desirable to be able to adjust the capacitance values of load capacitors 5 and 6 of the oscillator device of FIG. 1. The following description will show how such adjustment is made possible despite the very reduced number of connection terminals.

Figure 3:
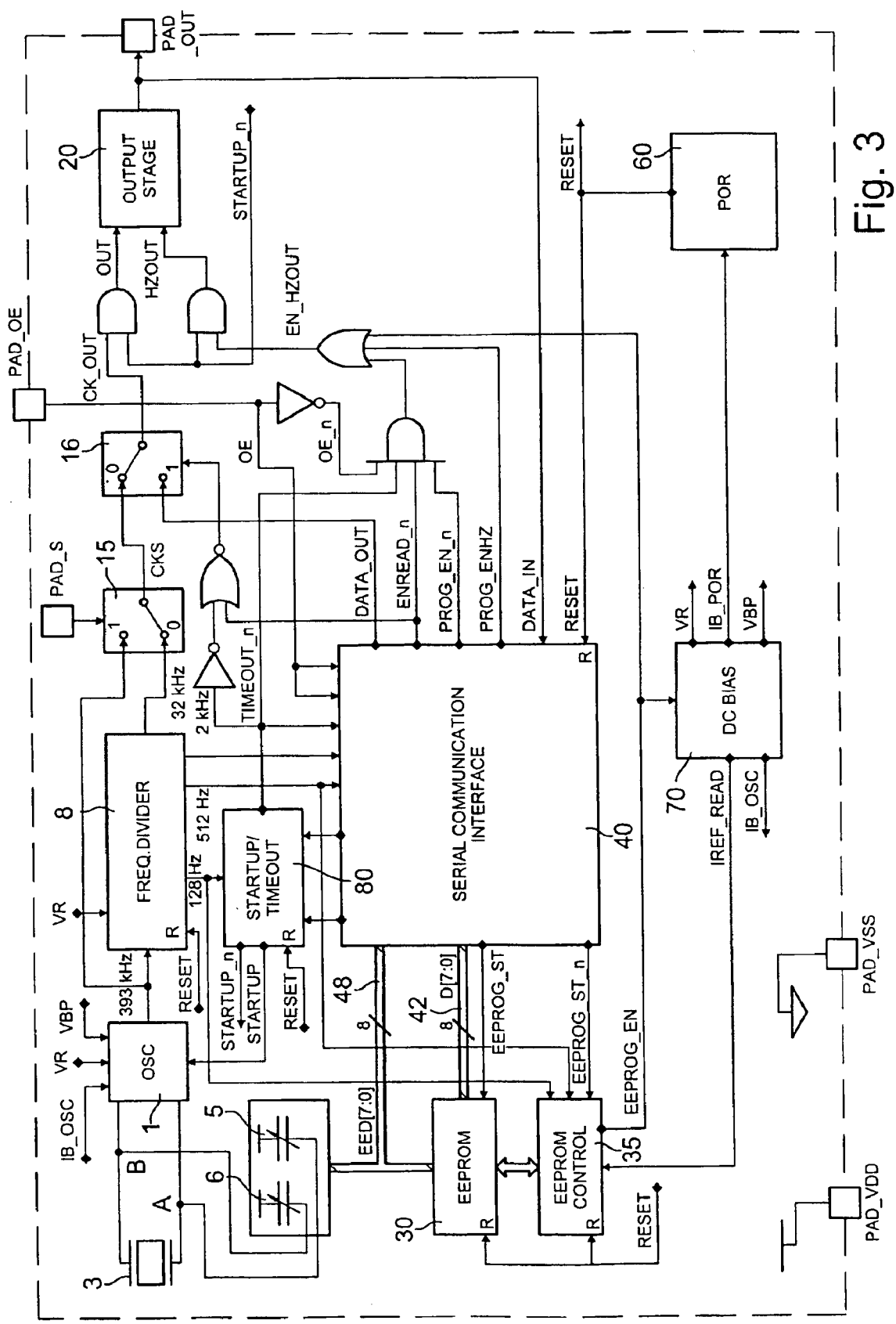
FIG. 3 is a block diagram of an electronic device including an oscillator circuit implementing the present invention.

FIG. 3 is a block diagram of an embodiment of the present invention allowing adjustment of capacitance values of load capacitors 5 and 6 of the oscillator device of FIG. 1. Quartz oscillator 3 can be seen again connected via its terminals A, B to inverter oscillator circuit 1. The value of load capacitors 5, 6 can be digitally adjusted by a binary word (in this example an 8-bit binary word EED [7:0]) able to be stored in a non-volatile memory 30, for example of the EEPROM (Electrically Erasable and Programmable Read Only Memory) type.

By way of illustration, oscillator circuit 1 is arranged to deliver an alternating output signal having a frequency substantially equal to 393,216 kHz (cf. the aforementioned European Patent Application), this signal being applied to the input of a divider circuit 8 allowing the frequency of the input signal to be divided to at least a first frequency substantially equal, in this example, to 32,768 kHz (=393, 216 kHz/12). This divider circuit also delivers various other clock signals to the various elements of the electronic device, namely in particular, signals of respectively 128 Hz, 512 Hz and 2 kHz. The numerical values of these frequencies (and the other numerical values mentioned in the present description) are of course given solely by way of example and are in no way limiting of the scope of the invention.

The signals delivered at the output of oscillator circuit 1 (signal at 393,216 kHz) and at the output of divider circuit 8 (signal at 32,768 kHz) are applied to a first selection stage 15. This selection stage 15 includes a control terminal, designated S, not accessible from the exterior of the package, allowing selection during manufacture (for example via making or not making of a metallisation) which of the signals at 393,216 kHz (S a the high logic state) or 32,768 kHz (S at the low logic state) has to be delivered at the output of selection stage 15 (signal CKS).

A second selection stage 16 is arranged downstream of selection stage 15 for delivering an output signal designated CK_OUT which is equivalent, as a function of the control signal applied to this stage, either to signal CKS emanating from first selection stage 15 or to read data DATA_OUT representative of the binary word stored in EEPROM memory 30 and to which we will return in more detail in the following part of the description.

Figure 4:
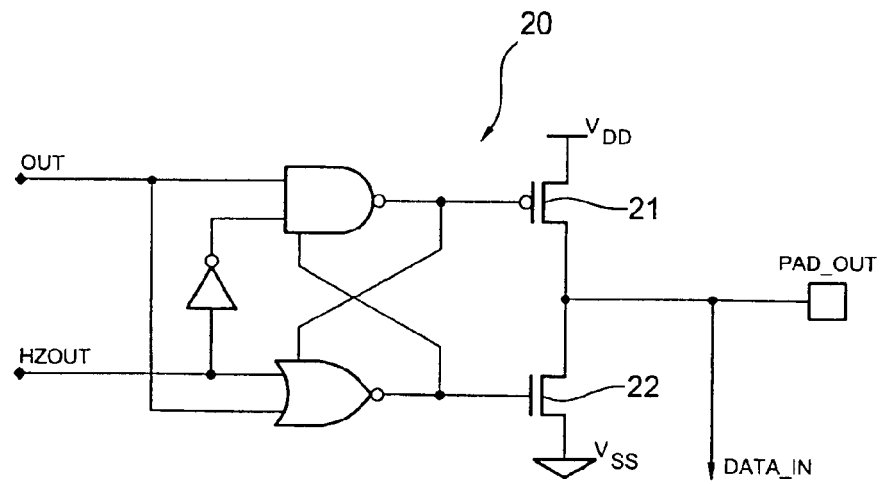
FIG. 4 is a detailed diagram of an output stage of the device of FIG. 3.

The output signal CK_OUT is applied through an AND gate to a first input (signal OUT) of an output stage 20 connected to output terminal PAD_OUT. Output stage 20 includes a second input to which is applied a control signal, designated HZOUT, allowing the impedance state of output PAD_OUT to be controlled, as will be seen hereinafter. FIG. 4 illustrates a detailed example of output stage 20.

The device illustrated in FIG. 3 further includes a serial communication interface 40 connected in particular to output and control terminals PAD_OUT and PAD_OE. As will be seen hereinafter in detail, communication interface 40 assures, in particular, control of the impedance state of output stage 20, control of the state of second selection stage 16 and the programming and reading of non-volatile memory 30. For the programming and read operations of non-volatile memory 30, interface 40 co-operates with a control circuit 35 of the EEPROM memory. The practical making of control circuit 35 or EEPROM memory 30 will not be described here in detail, since these elements are well known to those skilled in the art. One will simply mention that EEPROM memory 30 has sufficient capacity to store binary word EED[7:0] (namely at least 8 bits in this example), that communication interface 40 is arranged to deliver, for memory 30 and control circuit 35, a write activation signal (designated EEPROG_ST) to start writing the binary word in the memory and that control circuit 35 is arranged to deliver an activation signal, designated EEPROG_EN, when the memory is activated. It will also be noted that activation signal EEPROG_ST (namely a clock pulse) is generated when the write mode is interrupted in order to start the write phase in EEPROM memory 30 of data loaded by interface 40.

The data bits having to be stored in EEPROM memory 30 are designated D[i], i=0 to 7, and are transmitted by interface 40 to memory 30 by a first data bus 42 (of 8 bits in this example). Likewise, the data bits stored in the memory, designated EED[i], i=0 to 7, are transmitted on a second data bus 48 (also of 8 bits in this example) to adjustable capacitors 5 and 6, on the one hand, and to interface 40, on the other hand, for the purpose of reading.

The device illustrated in FIG. 3 also includes a power on reset or POR cell 60, a bias circuit 70 and an activation signal generator circuit 80. The power on reset cell 60, which can be any type of cell well known to those skilled in the art, has the essential function of delivering a zero reset signal RESET in a conventional manner when the electronic circuit is started, provided that the supply voltage remains lower than a determined initialisation threshold. This reset signal RESET is applied, in particular, to frequency divider circuit 8, to interface 40, to generator circuit 80, to EEPROM memory 30 and to control circuit 35.

Bias circuit 70 assures biasing and a regulated supply, in particular, of power on reset cell 60 (in this example via a bias current designated IB_POR), of oscillator circuit 1 (via a bias current IB_OSC and first and second regulated supply voltages VBP and VR), of divider circuit 8, and of control circuit 35 of memory 30 (via a reference current IREF_READ). Unless otherwise indicated, the various elements of the circuit are powered by the voltage present across supply terminals PAD_VDD and PAD_VSS of the circuit. Certain elements, such as oscillator 1 or divider circuit 8, are however powered at least partially, by a regulated intermediate supply potential VR delivered by bias circuit 70.

Figure 5:
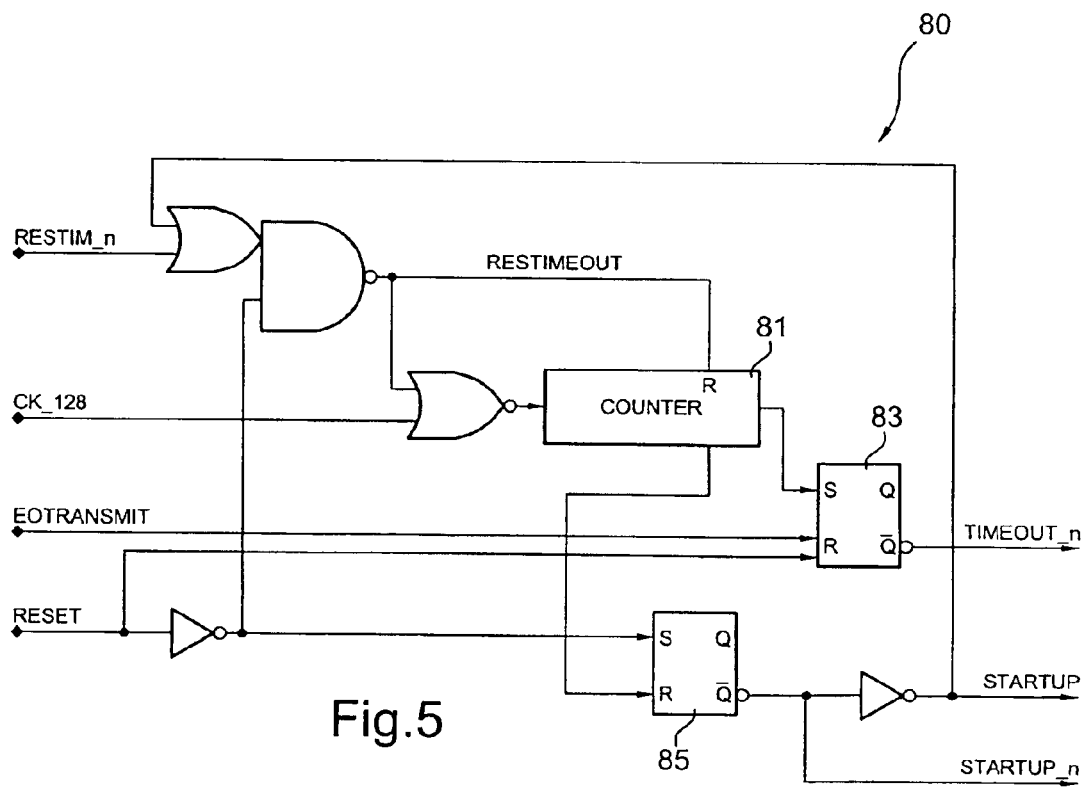
FIG. 5 is a detailed diagram of a circuit generating activation signals STARTUP and TIMEOUT_n evolving over time.

Activation signal generator circuit 80 is arranged to deliver a first activation signal, designated STARTUP, for controlling the state of oscillator circuit 1 during its start up phase, and a second activation signal, designated TIMEOUT_n, or more exactly an expiry signal, used in particular during read and programming operations of EEPROM memory 30. In particular, the signal TIMEOUT_n defines a determined time interval during which the read or write operations can be undertaken. At the end of this determined time interval, the device returns to its normal mode where it delivers the frequency signal CKS at one output. One need only to know at the moment that the first and second activation signals STARTUP and TIMEOUT_n each pass to a low logic state at the end of a determined time interval, respectively of 125 ms and 250 ms in this example. A detailed example of generator circuit 80 is illustrated in FIG. 5.

With reference again to transmission interface 40, it will be noted that it delivers a certain number of control signals which will now be briefly described. This various control signals are designated ENREAD_n (Not Enable Read), PROG_EN_n (Not Program Enable) and PROG_ENHZ (Program Enable High Impedance). By convention, the signal expressions followed by the index "_n" indicate that the signal is the opposite or inverse of the signal having the same prefix, i.e. ENREAD_n and PROG_EN_n are for example respectively the inverse of the signals ENREAD and PROG_EN.

Generally, the signal PROG_EN_n indicates whether the system is in a communication mode (PROG_EN_n at "0") where interface 40 is active and where data can be introduced into (write mode) or extracted from (read mode) EEPROM memory 30. According to the invention, the device is switched into communication mode by applying a determined voltage to control terminal PAD_OE. In the example which will be described hereinafter, this switching is for example carried out by applying a voltage equal to half the supply voltage to terminal PAD_OE, i.e. $V_{DD}/2$ (assuming $V_{ss}$=0).

The signal ENREAD_n indicates, in the case in which the device has been previously switched into communication mode, whether the system is specifically in the so-called read mode (ENREAD_n at "0") where one wishes to read the data stored in EEPROM memory 30. The signal PROG_ENHZ controls the impedance state of output stage 20 in write mode.

As illustrated in FIG. 3, the signals ENREAD_n and PROG_EN_n, on the one hand, and PROG_ENHZ, on the other hand, are used to control the impedance state of output stage 20. In this case, the signals ENREAD_n, PROG_EN_n and the inverse OE_n of signal OE applied to control terminal PAD_OE and the inverse TIMEOUT_n of activation signal TIMEOUT delivered by generator circuit 80, are applied to an AND gate with four inputs, the output of which is applied to the second control terminal (HZOUT) of output stage 20 through an OR gate with three inputs followed by an AND gate with two inputs. Signal PROG_ENHZ and activation signal EEPROG_EN of memory 30 originating from control circuit 35 are applied to the second control terminal of the output stage through the two remaining inputs of the OR gate.

It will be noted that the signal originating from the OR gate, designated EN_HZOUT, and signal CK_OUT originating from second selection stage 16 are respectively applied to the first OUT and second HZOUT inputs of stage 20 each through an AND gate with two inputs, the signal STARTUP_n being applied to the second input of each of these two AND gates. During the start-up phase of the oscillation circuit, the signal STARTUP is at the high logic state, thus blocking the two AND gates at the input of output stage 20. As soon as the oscillator circuit is in a steady state, at the end of a determined interval of time, fixed in this example to 125 ms, the signal STARTUP passes to the low logic state thus freeing the two AND gates.

With reference to FIG. 4, the structure and operation of output stage 20 will now be described in more detail. As illustrated, stage 20 includes, in particular, the series arrangement, between supply potentials $V_{DD}$ and $V_{SS}$, of a p-MOS transistor 21 and an n-MOS transistor 22. The connection node of transistors 21 and 22 is connected to the output terminal PAD_OUT of the device.

The gate of p-MOS transistor 21 is controlled by the signal originating from a NAND gate with two inputs to which are applied the first input signal OUT and the inverse of the second input signal HZOUT. The gate of n-MOS transistor 22 is controlled by the signal originating from a NOR gate with two inputs to which are applied signal OUT and signal HZOUT. The table below summarises the state of output PAD_OUT as a function of input signals OUT and HZOUT:

| HZOUT | OUT | PAD_OUT | Comments |
|---|---|---|---|
| 0 | 0 | $V_{ss}$ | output to ground (RESET) |
| 0 | CKS, DATA_OUT | CKS, DATA_OUT | frequency or data signal delivered at output |
| 1 | 0, 1 | HIGH-IMPEDANCE | output capable of receiving data |

With reference to FIGS. 3, 4 and to the table above, it will be understood that signal HZOUT is brought to the high logic state (assuming that signal STARTUP_n is in the high logic state) (1) if activation signal EEPROG_EN is at the high logic state, (2) if control signal PROG_ENHZ is at the high logic state, or (3) if the signal resulting from the AND logic combination of signals OE_n, TIMEOUT_n, ENREAD_n and PROG_EN_n is at the high logic state. In other words, output PAD_OUT is in the high impedance state (1) if memory 30 is active, (2) if the system is in write mode, or (3) if control terminal PAD_OE is brought to ground $V_{SS}$ while the system is neither in communication mode (PROG_EN=0), nor in read mode (EN_READ=0) and expiry signal TIMEOUT is at the low logic state (TIMEOUT_n=1).

Figure 6:
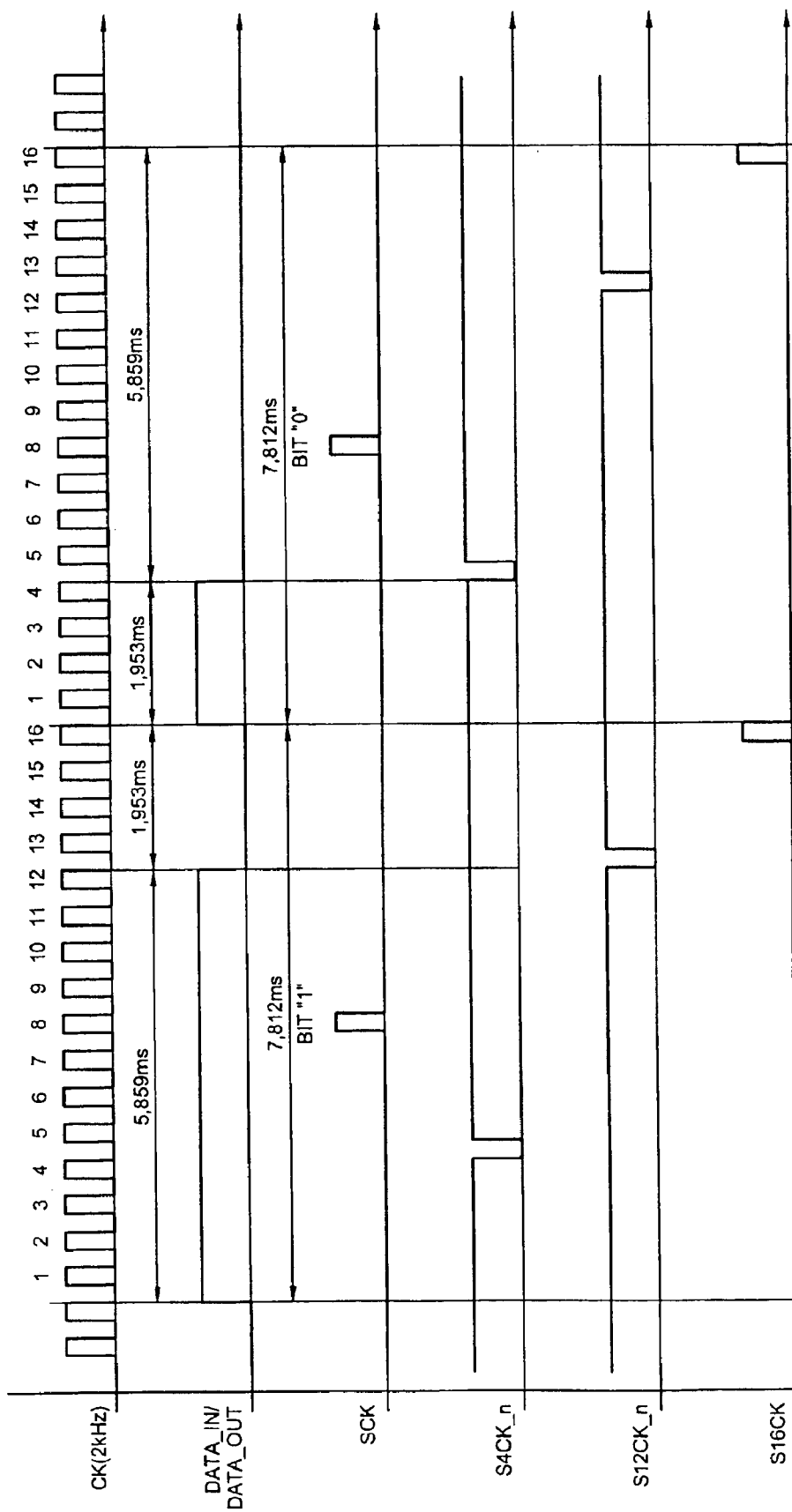
FIG. 6 is a diagram illustrating the shape of the data bits and clocking signals generated by the device of FIG. 3.

In this high impedance state, output PAD_OUT can thus be used as an input terminal, in particular for introducing in serial form data which has to be stored in EEPROM memory 30 as will be seen hereinafter (FIG. 6 shows the shape of data bits transmitted to or by serial communication interface 40). As illustrated in FIG. 3, serial communication interface 40 thus includes a data input DATA_IN directly connected to output terminal PAD_OUT.

As soon as signal HZOUT is at the low logic state, output PAD_OUT takes the state of the first input of stage 20 to which is applied the signal OUT, i.e. frequency signal CKS or data signal DATA_OUT delivered by a data output of interface 40 as a function of the state of selection stage 16. During the start-up phase (STARTUP_n=0), output PAD_OUT is forced to ground $V_{SS}$.

By means of FIG. 5, an embodiment example of circuit 80 for generating activation signals STARTUP and TIMEOUT will now be briefly described. As already mentioned hereinbefore, signal STARTUP takes the high logic state during start-up of oscillator circuit 1 and passes to the low logic state at the end of a determined interval of time, fixed by way of example to 125 ms, directly following initialisation of the device. The inverse TIMEOUT_n of signal TIMEOUT is at the high logic state as long as the device is not switched into communication mode (PROG_EN=0) and passes to the low logic state at the end of a determined time interval, fixed by way of example to 250 ms, following the passage to the high logic state of signal PROG_EN.

Figure 9:
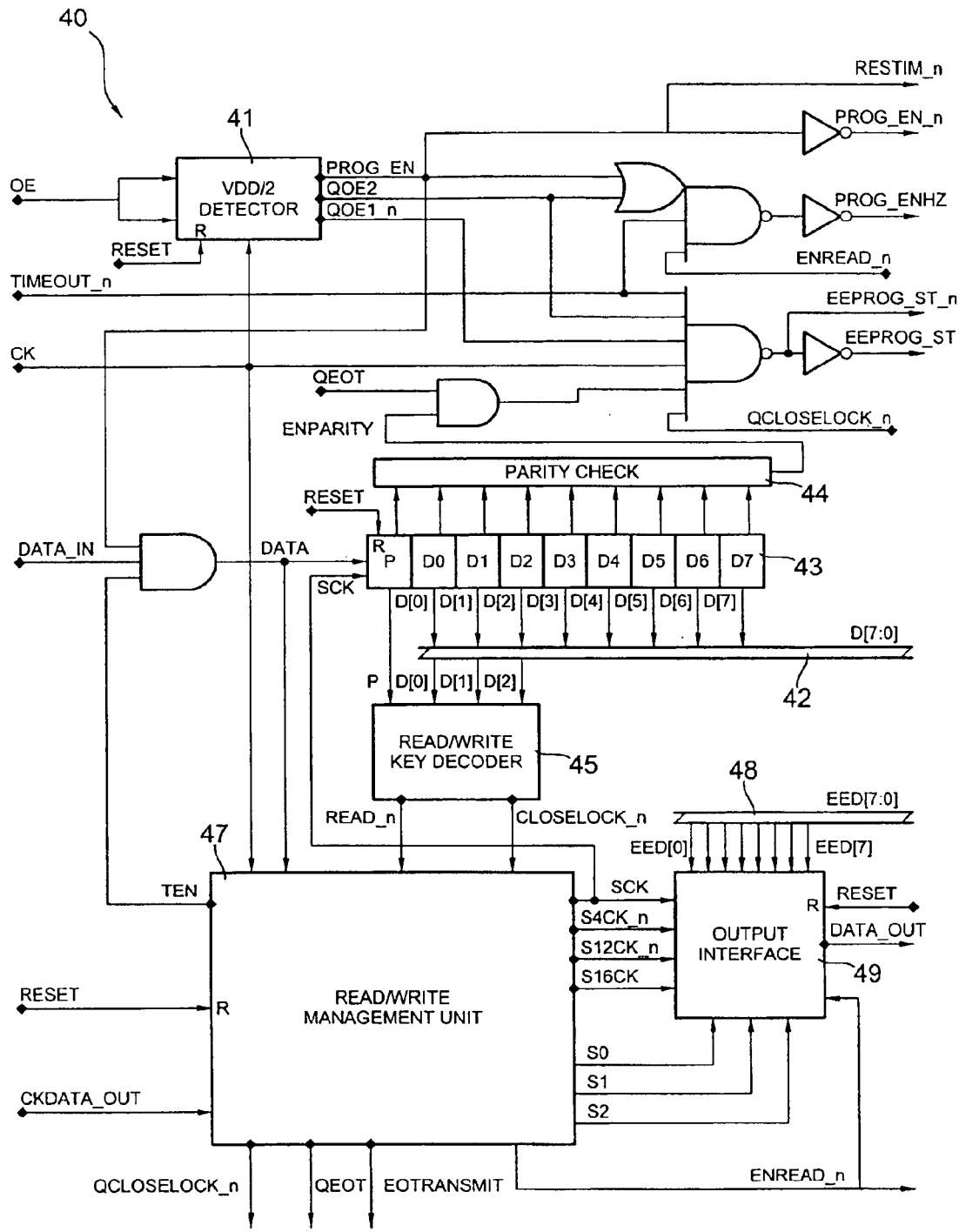
FIG. 9 is a detailed diagram of a serial communication interface of the device of FIG. 3.
Figure 11:
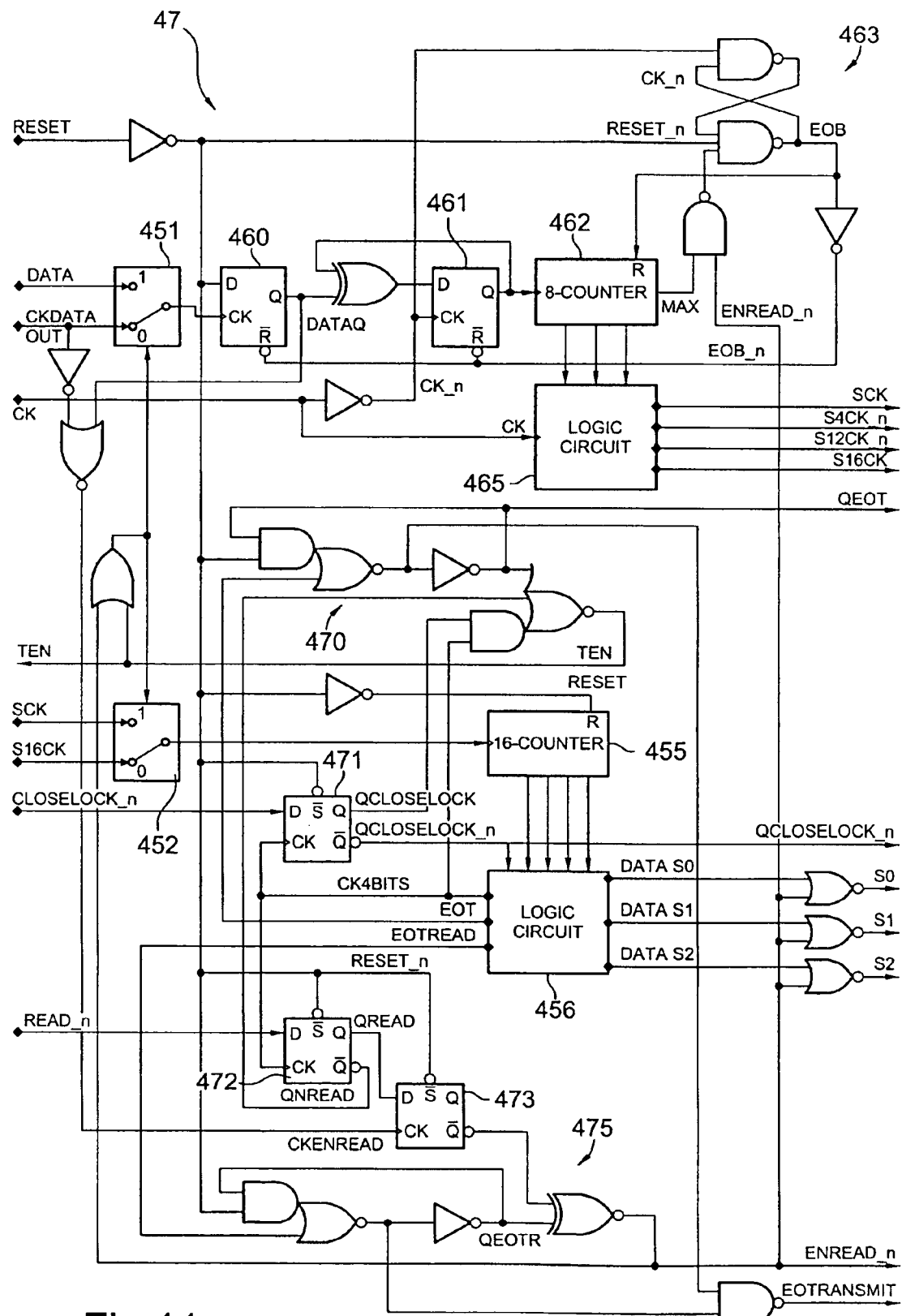
FIG. 11 is a detailed diagram of a read and write operation control unit for the interface of FIG. 9.

In FIG. 5, the signal designated RESTIM_n corresponds to the control signal PROG_EN (cf. FIG. 9) and the signal designated EOTRANSMIT is a signal indicating the end of the data loading process, in write mode, or the end of the data transmission process, in read mode (cf. FIGS. 9 and 11). These signals RESTIM_N and EOTRANSMIT are transmitted to generator circuit 80 by interface 40. Clock signal CK_128 is a clock signal delivered by frequency divider circuit 8 having, in this example, a frequency of 128 Hz.

Generator circuit 80 of FIG. 5 includes a counter 81 (in this case a counter-by-32) delivering at one output a first signal intended to reset terminal R of a first bistable trigger circuit S-R 85 and a second signal intended for excitation terminal S of a second bistable trigger circuit S-R 83. The first output signal of counter 81 takes the high logic state as soon as 16 pulses have been counted (16×1/128=125 ms). The second output signal takes the high logic state as soon as 32 pulses have been counted by counter 81 (32×1/128=250 ms).

Excitation terminal S of first bistable trigger circuit S-R 85 is controlled by the inverse RESET_n of initialisation signal RESET. The inverted output of this first bistable trigger circuit 85 delivers the inverse STARTUP_n of the signal STARTUP, the latter being applied to a first input of an OR gate with two inputs. The signal RESTIM_n (=PROG_EN) is applied to the second input of this OR gate. The output of the OR gate and the signal RESET_n are applied to the two inputs of a NAND gate whose output controls initialisation terminal R of counter 81 as well as the clock input of this counter 81 via a NOR gate. Initialisation signal RESET as well as the end-of-transmission signal EOTRANSMIT are both applied to initialisation terminal R of second bistable trigger circuit S-R 83, at the inverted output of which is delivered signal TIMEOUT_n.

Those skilled in the art will easily understand, upon reading FIG. 5, that the counter is activated for the first time as soon as initialisation signal RESET passes to the low logic state, signal STARTUP then taking the high logic state for 125 ms to return to the low logic state at the end of this time interval, counter 81 then being initialised again (RESTIMEOUT=1). As soon as the device's communication mode is activated following detection of the application of voltage $V_{DD}/2$ to control terminal PAD_OE, signal RESTIM_n (=PROG_EN) takes the high logic state and starts counter 81. Signal TIMEOUT_n keeps thus its high logic state during 250 ms to pass to the low logic state at the end of this time interval. It will be noted that signal TIMEOUT_n keeps the high logic state at the end of the 250 ms if the end-of-transmission signal EOTRANSMIT passes to the high logic state during this same interval.

In the embodiment example illustrated in the Figures, data transmission to or from serial communication interface 40 employs a pulse width modulation technique. A non-limiting example is illustrated in FIG. 6.

According to this example, a data bit has a period of approximately 7.812 ms equivalent to sixteen successive pulses of a clock signal of 2 kHz (also delivered by the frequency divider circuit, signal CK). More specifically, a data bit "1" is defined as a signal which is at the high logic level for approximately 5.859 ms (i.e. twelve successive pulses of the clock signal) then at the low logic level for the rest of the period (i.e. the remaining four clock pulses). Conversely, a data bit "0" is defined as a signal which is at the high logic level for approximately 1, 953 ms (i.e. four successive pulses of the clock signal) then at the low logic level for the rest of the period (i.e. the remaining twelve clock pulses). According to the embodiment example of the present invention, the data bits are introduced (DATA_IN) or extracted (DATA_OUT) in accordance with the diagram of FIG. 6.

Figure 7:
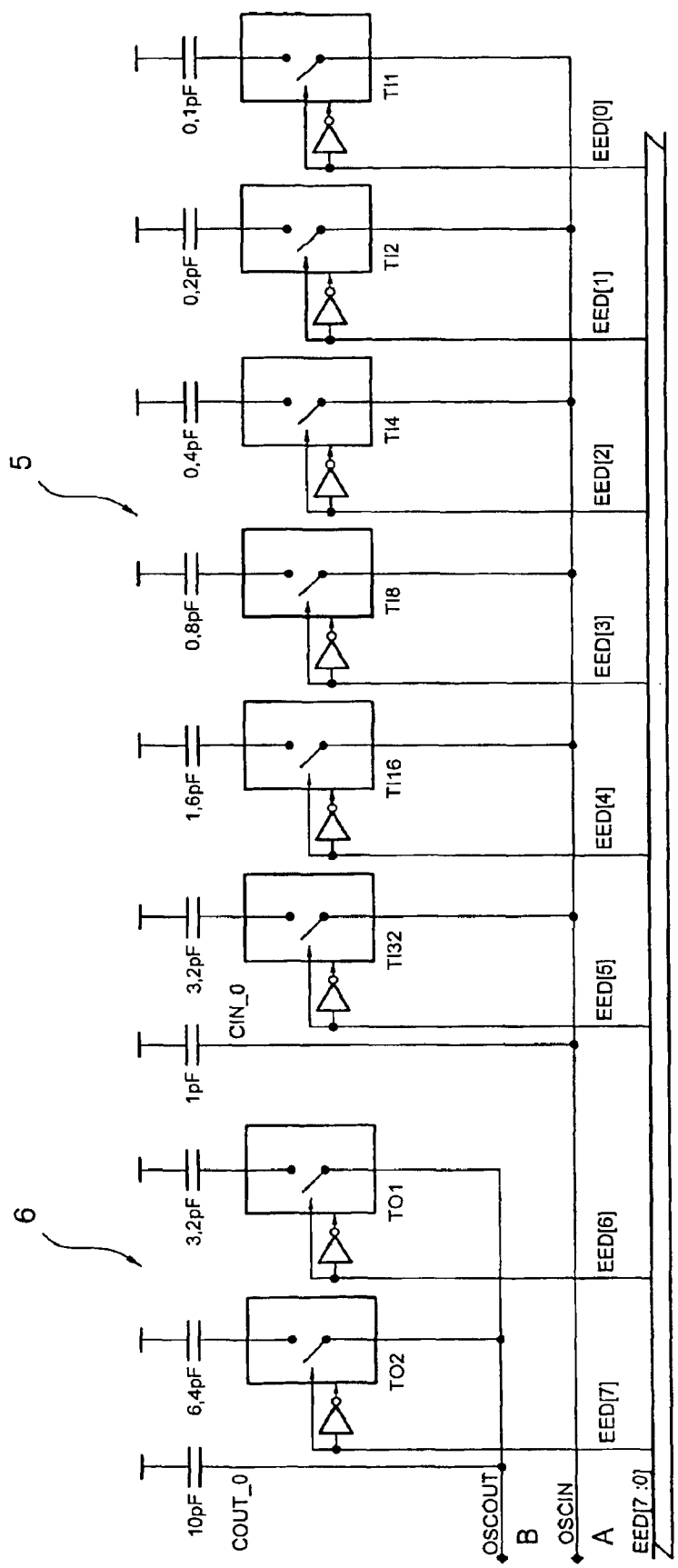
FIG. 7 is a diagram of a switched capacitor network of the device of FIG. 3 allowing adjustment of the capacitance value of the load capacitors of the oscillator circuit of FIG. 1.
Figure 8:
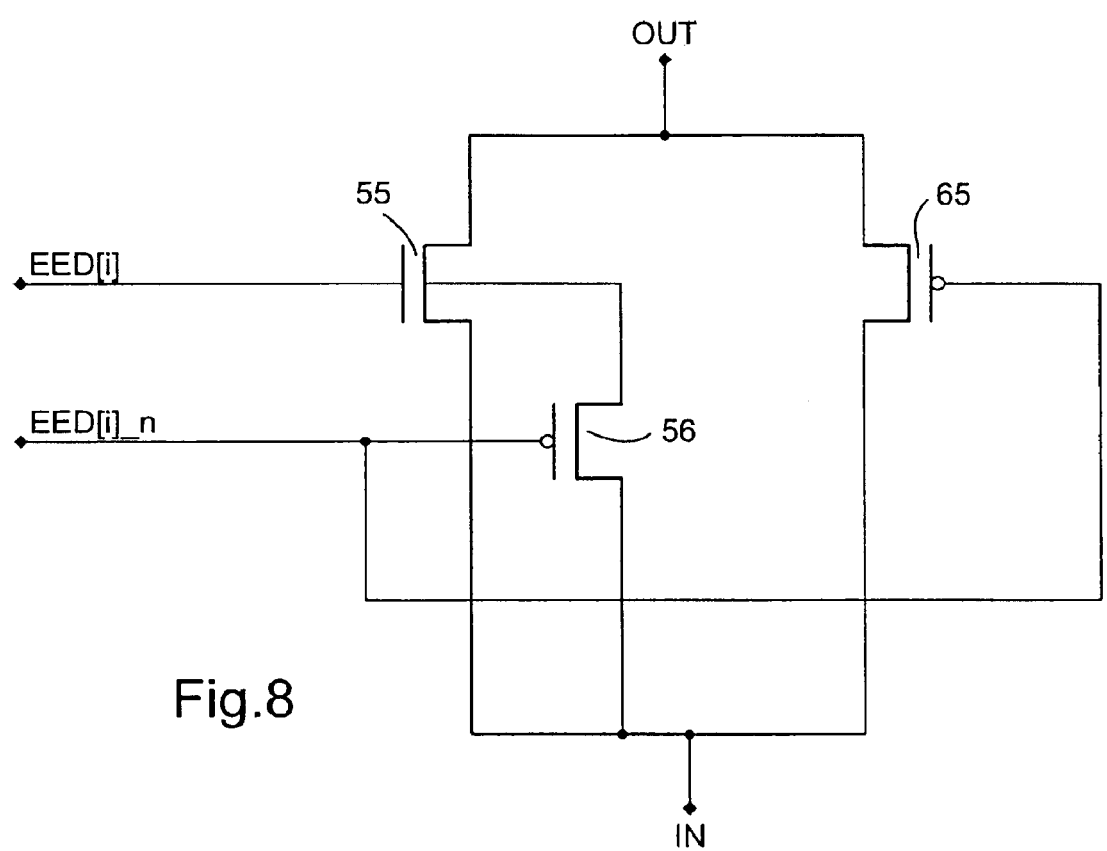
FIG. 8 is a detailed diagram of a switch used in the switched capacitor network of FIG. 7.

With reference now to FIG. 3 and to FIGS. 7 and 8, the structure of the adjustable load capacitors 5 and 6, whose value is controlled by the state of the binary word stored in EEPROM memory 30, will now be briefly described. In the example of the Figures, the value of load capacitors 5, 6 is adjusted as a function of an 8-bits binary word of EED[7:0] stored in memory 30. The two most-significant bits EED[7] and EED[6] define the capacitance value of load capacitor 6 placed at the oscillator output terminal B (OSCOUT) and the six other bits EED[5] and EED[0] define the capacitance value of capacitor 5 placed at the oscillator input terminal A (OSCIN).

In accordance with the illustration of FIG. 7, each capacitor is formed of the parallel arrangement of a nominal capacitor COUT_0, respectively CIN_0, and several capacitors each connected in series with a switch TO2, TO1, respectively TI32, TI16, TI8, TI4, TI2 and TI1, controlled by the state of the corresponding bit of the stored word EED [7:0].

Analytically, the capacitance value of input capacitor 5 and output capacitor 6 is defined as follows:

$$C_{IN} = \text{CIN\_0} + \sum_{i=0}^{5} 2^i \cdot EED[i] \cdot \Delta C_{STEP}$$

$$C_{OUT} = \text{COUT\_0} + \sum_{i=6}^{7} 2^{i-1} \cdot EED[i] \cdot \Delta C_{STEP}$$

Where $\Delta C_{STEP}$ is equivalent in this case to 0.1 pF and where CIN_0 and COUT_0 have been chosen respectively, purely by way of illustration, at 1 pF and 10 pF. The capacitance value is thus weightened as a function of the weight of the bit concerned. The capacitance value of input capacitor 5 is thus adjustable from 1 pF to 7.3 pF by steps of 0.1 pF, and the capacitance value of output capacitor 6 from 10 pF to 19.6 pF by steps of 3.2 pF. The fact that the aforementioned numerical values are only illustrative and in no way constitute a limitation of the scope of the invention should be stressed again.

Preferably, switches TO1, TO2, and TI1 to TI32 are configured to operate at reduced voltages. FIG. 8 shows an embodiment example of such a switch, or transmission gate, including, in particular, the parallel arrangement of an n-MOS transistor 55 and a p-MOS transistor 65 connected to each other via their drain and source terminals. In this example, in order to reduce the operating voltage of the device, one acts on the threshold voltage of at least one of the two transistors 55, 65, via is bulk terminal. In this case, the threshold voltage of n-MOS transistor 55 is acted on by means of an additional p-MOS transistor 56 whose source is connected to the bulk terminal of n-MOS transistor 55 and whose drain is connected to the source of n-MOS transistor 55. The gate of n-MOS transistor 55 is controlled by the state of the corresponding memory bit [i] and the gates of p-MOS transistors 65 and 56 by the inverse state EED[i] _n of the memory bit.

It will be noted that it is alternatively possible to act on the threshold voltage of p-MOS transistor 65 via an additional n-MOS transistor or even to act simultaneously on the threshold voltages of n-MOS transistor 55 and p-MOS transistor 65, these possibilities being essentially determined by the technology used and the availability of an individual contact with the bulk terminal of each transistor. By way of example, BICMOS or SOI (Silicon on Insulator) technology makes such individual contact with the transistor bulk possible.

With reference to FIG. 9, the general operation of serial communication interface 40 will now be described. The latter essentially includes a communication mode detection and activation unit 41 connected to control terminal PAD_OE, a shift register 43 for allowing serial loading of data introduced via output terminal PAD_OUT at data input DATA_IN of the interface, a key decoding circuit 45, a read and write operation control unit 47, and an output interface 49 for the serial emission, during a read operation, of stored data bits.

The table below summarises the states of the main signals as a function of the operating state of the interface:

application of the switching voltage at control terminal PAD_OE is stopped. Likewise, signal QOE1_n and signal QOE2 are used jointly (in combination with expiry signal TIMEOUT_n, clock signal CK and two additional auxiliary signals) for generating a clock pulse EEPROG_ST for a memory write operation.

As illustrated in FIG. 9, control signal PROG_ENHZ is derived from the AND logic combination of signal ENREAD_n, TIMEOUT_n and the signal resulting from the OR logic combination of signals PROG_EN and QOE2. Thus, as soon as the signal PROG_EN passes to the high logic state (or the signal QOE2 is still in this state), the control signal PROG_ENHZ is activated to switch output stage 20 of the device into the high impedance state and allow introduction of data via output terminal PAD_OUT.

The introduced data DATA_IN is delivered to the input of an AND gate which is additionally controlled by signal PROG_EN and a control signal TEN ("Transmission Enable"). This control signal TEN is normally at the high logic state and only passes to the low logic state if the interface read mode is activated as will be understood upon reading FIG. 11 hereinafter. In the normal state, thus, the AND gate is conducting and delivers the introduced data, designated DATA, to the output of the AND gate, at the input of shift register 43.

This shift register 43 includes in this example nine positions in order, in particular, to allow loading of eight data bits as well as a ninth so-called parity bit allowing any transmission error check. In this regard, a parity check unit 44 is connected to the nine positions of shift register 43, this check unit delivering an activation signal ENPARITY passing to the high logic state if the parity of the sequence introduced is correct.

The shift register is clocked by a clock signal SCK generated by control unit 47. This clock signal SCK illustrated in FIG. 6, in the same way as clock signals S4CK_n, S12CK_n and S16CK, essentially consists of a pulse at the

| State | PROG_EN | PROG_ENHZ | ENREAD_n | TIMEOUT_n |
|---|---|---|---|---|
| Initialisation RESET = 1 | 0 | 0 | 1 | 1 |
| Normal mode RESET = 0 STARTUP = 1 | 0 | 0 | 1 | 1 |
| Communication and write mode (no read) | 1 | 1 | 1 | 1 (t < 250 ms) |
| Read mode | 1 | 0 | 0 | 1 (t < 250 ms) |
| Expiry of time (t > 250 ms) | 0 | 0 | 1 | 0 then return to 1 after initialisation |

Figure 10:
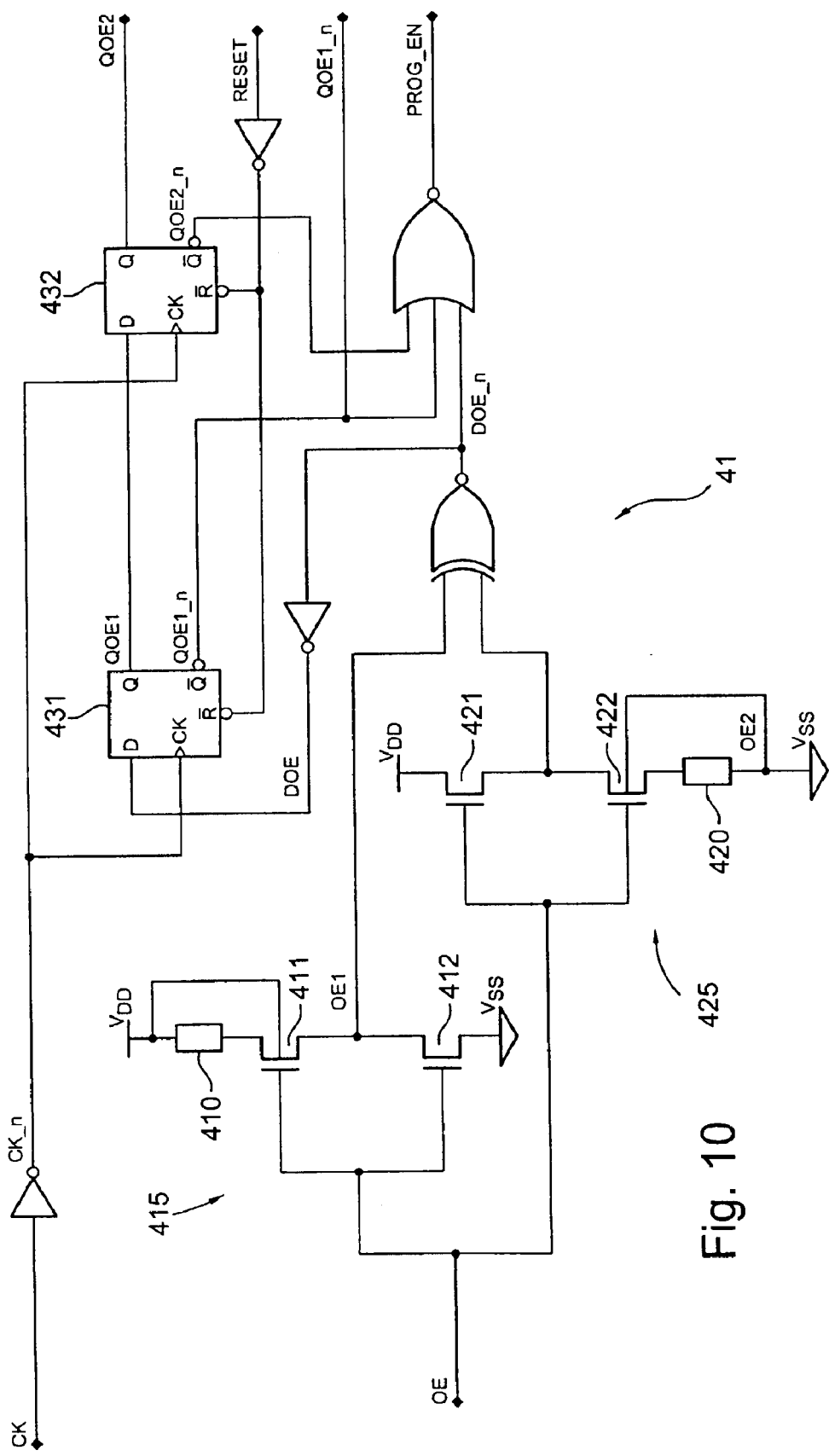
FIG. 10 is a detailed diagram of a circuit detecting the application, at a control terminal of the device of FIG. 3, of a determined voltage level.

Generally, a write or read operation of EEPROM memory 30 starts with the activation of the interface communication mode. This activation is carried out, as already mentioned, by applying a determined voltage, in this example half $V_{DD}/2$ of the supply voltage, to control terminal PAD_OE. FIG. 10, which will be discussed in more detail hereinafter, presents an embodiment example of detection circuit 41 delivering activation signal PROG_EN (as well as auxiliary activation signals designated QOE2 and QOE1_n). As will be understood upon reading FIG. 10, auxiliary signal QOE2 is configured to pass back to the low logic level with a certain delay with respect to signal PROG_EN. This signal QOE2 is used, in particular, to keep output PAD_OUT for a short moment in the high impedance state when the high logic level coinciding with the eighth pulse of reference signal CK. At each pulse of signal SCK, the corresponding value of the input signal, i.e. the high logic level during transmission of bit "1" or the low logic level during transmission of bit "0" as illustrated in FIG. 6, is loaded in a position of shift register 43.

Preferably, and for reasons of security, the introduction of data starts with the transmission of a write or read key preceding the actual data bits. In this example, the data takes the form of a sequence of thirteen bits:

K[3]-K[2]-K[1]-K[0]-D[7]-D[6]-D[5]-D[4]-D[3]-D[2]-D[1]-D[0]-P transmitted in accordance with the diagram of FIG. 6 and including four first key bits K[3] to K[0], eight data bits D[7] to D[0] (transmitted from the most-significant bit to the least-significant bit) and a parity bit P.

Thus, the four key bits K[3], K[2], K[1] and K[0] are first of all loaded respectively in positions D[2], D[1], D[0] and P of shift register 43. These first four positions are connected to the inputs of key decoding circuit 45 which generates at one output a first signal designated READ_n taking the low logic state if the read key (READ KEY) has been introduced, and a second signal designated CLOSELOCK_n taking the low logic state if the write key (WRITE KEY) has been introduced.

Generally, if none of the keys provided is introduced, data loading into shift register 43 is interrupted by the passage of signal TEN applied to AND input gate to the low logic state. Likewise, if the read key has been introduced, signal TEN also passes to the low logic state in order to lock the input of shift register 43. Conversely, in the event that the write key has been introduced, signal TEN remains at the high logic level in order to allow data loading to continue, i.e. loading of data bits D[7] to D[0] and parity bit P.

The read and write processes will be explained in more detail hereinafter with reference to FIG. 11. It will be noted already that read and write operation control unit 47 receives at one input clock signal CK (here at 2 kHz), signal DATA originating from the AND input gate (this signal being used as a synchronisation signal in particular for deriving clock signal SCK from shift register 43), a clock signal CKDATA_OUT, in this example of 512 Hz (used in particular for deriving clock signals SCK, S4CK_n, S12CK_n and S16CK during the read process), initialisation signal RESET and read and write key introduction indicators READ_n, CLOSELOCK_n. Control unit 47 delivers at one output clocking signals SCK, S4CK_n, S12CK_n and S16CK, selection signals S0, S1, S2 for output interface 49, read mode activation signal ENREAD_n, a write mode activation signal QCLOSELOCK_n (used for generating control signal EEPROG_ST), an end-of-loading signal QEOT of the thirteen data bits (also used for generating control signal EEPROG_ST) and the aforementioned end-of-transmission signal EOTRANSMIT (used by generator circuit 80—FIG. 5—for initialising bistable trigger circuit S-R delivering signal TIMEOUT_n).

With reference to FIG. 10, an embodiment example of detection circuit 41 will now be presented. As illustrated, control signal OE emanating from control terminal PAD_OE is applied to the input of two inverter circuits 415, 425, each including a p-MOS transistor 411, 421 respectively, and an n-MOS transistor 412, 422 respectively, connected gate to gate and drain to drain between supply potentials $V_{DD}$ and $V_{SS}$. The first inverter 415 further includes a resistive element 410 placed between the source of p-MOS 411 and potential $V_{DD}$ whereas the second inverter 425 includes a resistive element 420 placed between the source of n-MOS 422 and potential $V_{SS}$. Consequently, each inverter has a response which could be termed asymmetrical and generates an output signal OE1, OE2 respectively, whose switching threshold respectively precedes or follows the passage of signal OE through intermediate level $V_{DD}/2$ (or more exactly, $(V_{DD}-V_{SS})/2$). The XOR logic combination allows a signal, designated DOE, to be delivered, passing to the high logic state in proximity to voltage level $V_{DD}/2$.

In this case, signals OE1 and OE2 are applied to the two inputs of an NXOR gate in order to deliver the inverse DOE_n of signal DOE. Signal DOE is applied to input D of a first bistable trigger circuit D 431, its output signal QOE1 being applied to input D of a second bistable trigger circuit D 432 whose output delivers the aforementioned signal QOE2. Each bistable trigger circuit is clocked by clock signal CK and initialised by initialisation signal RESET. The inverted outputs QOE1_n and QOE2_n of the two bistable trigger circuits 431 and 432, as well as signal DOE_n are applied to the three inputs of an NOR gate in order to generate communication mode activation signal PROG_EN.

Upon reading FIG. 10, it will easily be understood that signal PROG_EN remains at the high logic level as long as the three signals DOE_n, QOE1_n and QOE2_n are at the low logic level. It will easily be understood that, following the return of signal PROG_EN to the low logic level (as soon as a substantially different voltage to $V_{DD}/2$ is applied to control terminal PAD_OE), signal QOE2 is held at the high logic level approximately during one period of clock signal CK, thus holding control signal PROG_ENHZ at the high logic level as already mentioned above.

Figure 12:
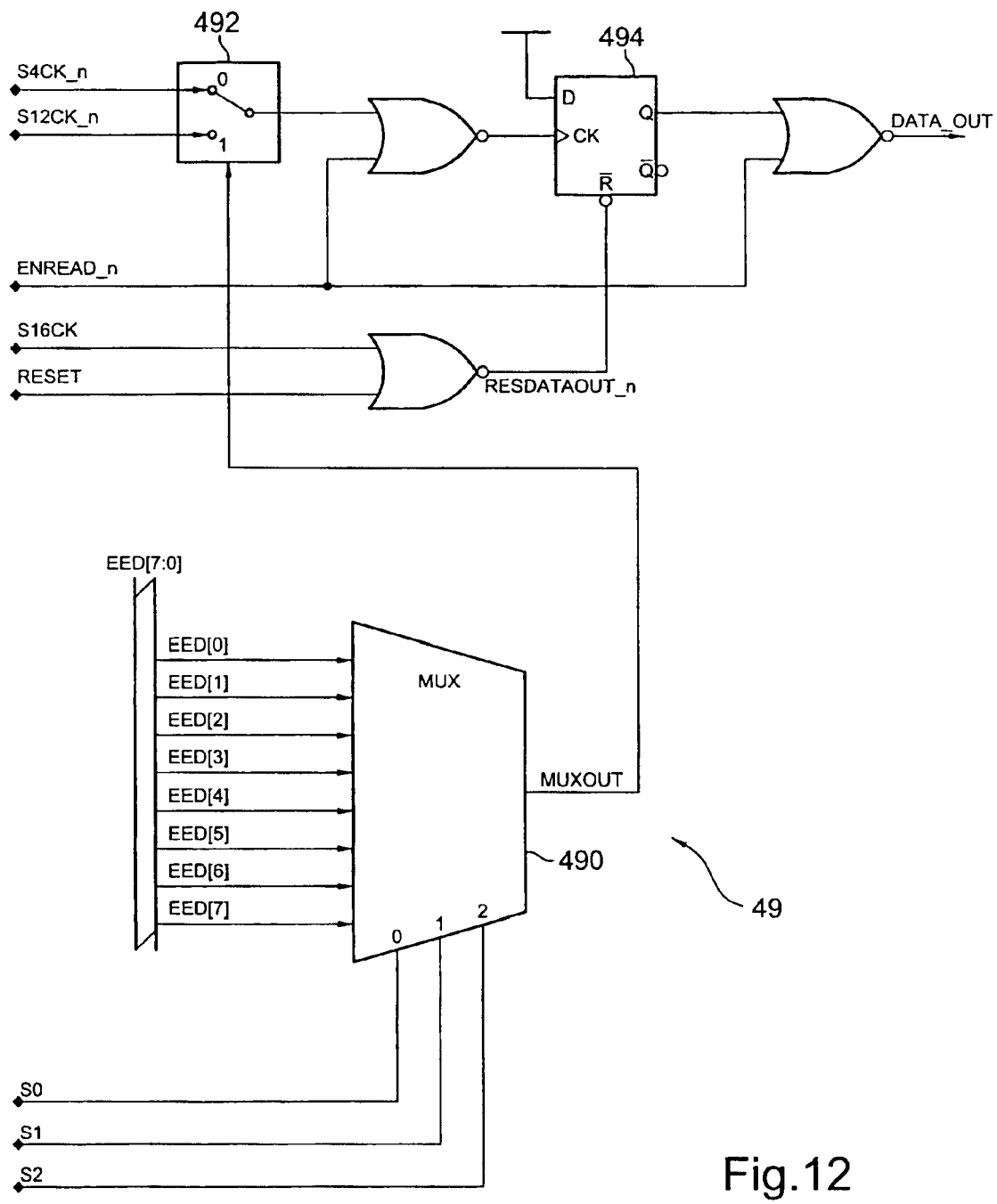
FIG. 12 is a detailed diagram of an output interface of the serial communication interface of FIG. 9 allowing an output signal DATA_OUT to be delivered, which signal is representative of the data stored in the memory of the device of FIG. 3.

FIG. 12 shows an embodiment example of output interface 49. This output interface essentially includes a multiplexer 490 (here with eight inputs) to the inputs of which are applied data bits EED[0] to EED[7] stored in EEPROM memory 30 and transmitted on data bus 48, a selection stage 492 comprising two inputs onto which clock signals S4CK_n and S12 CK_n are applied and a bistable trigger circuit D 494.

Selection signals S0, S1, S2 generated by control unit 48 assure the sequential selection of data bits EED [0] to EEP [7] which are successively transmitted by output terminal MUXOUT of multiplexer 490 to the control input of selection stage 492. The output of this stage 492 is applied to the clock input of bistable trigger circuit 494 via a first NOR gate, the signal ENREAD_n being applied to the second input of this NOR gate. Input D of bistable trigger circuit 494 is at the high logic level and its non-inverted output is applied to the input of a second NOR gate at the second input of which is also applied the signal ENREAD_n. This second NOR gate delivers at its output data signal DATA_OUT. Clocking signal S16CK and initialisation signal RESET are applied to the inputs of a third NOR gate delivering an initialisation signal RESDATAOUT_n to the inverted initialisation terminal of bistable trigger circuit D 494. As illustrated in FIG. 6, signal S16CK has a leading edge coinciding with the sixteenth pulse of clock signal CK thus allowing periodic initialisation of bistable trigger circuit 494 at the end of the transmission of a bit.

Upon reading FIG. 12, it will easily be understood that, in read mode (ENREAD_n=0), as a function of the stored bit EED[i], clocking signal S4CK_n (bit EED[i] to 0) or clocking signal S12CK_n (bit EED[i] to 1) is selected by stage 492 and the inverse of these signals is consequently applied to the clock input of bistable trigger circuit D 494. As illustrated in FIG. 6, signals S4CK_n and S12CK have a trailing edge (passage from the high logic level to the low logic level) coinciding with the fourth, respectively twelfth, pulse of clock signal CK.

Thus, if the stored data bit EED[i] has a value of 0, the output of bistable trigger circuit 494 passes to the high logic state at the end of four pulses of signal CK and if data bit EED[i] has a value of 1, the output of the trigger passes to the high logic level at the end of twelve pulses of clock signal CK. As the output Q of bistable trigger circuit 494 is inverted by the second NOR gate, it will be understood that signal DATA_OUT will actually have the shape shown in FIG. 6 as a function of the bit to be transmitted.

Of course, if the read mode is not active (ENREAD_n=1), the clock input of bistable trigger circuit D 494 as well as output DATA_OUT are blocked.

With reference to FIG. 11, a detailed embodiment example of read and write operation control unit 47 will now be described.

Control unit 47 includes first of all a first selection stage 451, first and second bistable trigger circuits D460 and 461, a first counter 462 (here by eight) and a first logic circuit 465 connected to the various stages of counter 462. These elements 451, 460, 461 and 462 form, with the associated logic, a circuit generating clocking signals SCK, S4CK_n, S12CK_n and S16CK.

Clock signal CKDATA_OUT (at 512 Hz in this example) and data signal DATA originating from the input of shift register 43 are applied to the first and second inputs of stage 451 whose output is applied to the clock input of first bistable trigger circuit 460, the inverse RESET_n of the initialisation signal being applied to input D of this trigger 460. The non-inverted output DATAQ of bistable trigger circuit 460 is applied to the input of second bistable trigger circuit D 461 via an XOR gate whose second input is coupled to the non inverted output of second bistable trigger circuit 461. This non-inverted output of second bistable trigger circuit 461 is also applied to the clock input of counter 462. The clock input of trigger D 461 is further clocked by the reverse CK_n of clock signal CK (2 kHz).

A memory element or latch 463 conventionally formed of two interconnected NAND gates assures the production of an initialisation signal EOB of counter 462 and of the two triggers D 460 and 461. The inverse CK_n of clock signal CK is applied to a first input of latch 463 (input terminal of the first NAND gate). The NAND logic combination of signal ENREAD_n and the output signal designated MAX of counter 462 (MAX passes to the high logic level when the counter has reached its maximum count), on the one hand, and the inverse RESET_n of the initialisation signal, on the other hand, are applied to the other input of latch 463 (input terminal of the second NAND gate). The initialisation signal EOB is picked up at the output of the second NAND gate.

Those skilled in the art will be perfectly able to understand the interaction of the aforementioned elements upon reading FIGS. 6 and 11 and the indications that have just been presented. It will simply be noted that selection stage 451 is controlled (by the OR logic combination of signals TEN and ENREAD_n) to deliver signal DATA to the input of bistable trigger circuit 460 when data is loaded in shift register 43 (TEN=1 or READEN_n=1) or to deliver clock signal CKDATA_OUT when read mode is activated (TEN=0 and READEN_n=0). Consequently, clocking signals SCK, S4CK_n, S12CK_n and S16CK are synchronised on the edges of data signal DATA when data is loaded in register 43 or on the edges of clock signal CKDATA_OUT when data is read.

Control unit 47 includes, secondly, a second selection stage 452, a second counter 455 (here by sixteen) and a second logic circuit 456 connected to the stages of counter 455 to deliver selection signals DATA S0, DATA S1 and DATA S2. These elements 452, 455 and 456 form, with the associated logic, a circuit generating activation signals CK4BITS, EOT and EOTREAD and selection signals S0, S1, S2 (formed respectively of the NOR logic combination of signal ENREAD_n and signals DATA S0, DATA S1, DATA S2). The signal CK4BITS is an end-of-transmission indicator of the first four data bits (i.e. the four key bits K[3] to K[0], and signals EOT and EOTREAD are respectively indicators of the end of loading of the thirteen data bits (in write mode) and the end of generating output signal DATA_OUT (in read mode).

Clocking signal S16CK (a pulse at the end of transmission of a bit) and clocking signal SCK (originating from the clocking signal of shift register 43) are applied to the first and second inputs of stage 452 whose output is applied to the clock input of counter 456 whose initialisation terminal is controlled by initialisation signal RESET.

Those skilled in the art will again be perfectly able to understand the interaction of the aforementioned elements upon reading FIGS. 6 and 11 and the indications that have just been given. It will simply be noted that selection stage 452 is controlled (also by the OR logic combination of signals TEN and ENREAD_n) so as to deliver signal SCK to the input of counter 455 when data is loaded in shift register 43 (TEN=1 or READEN_n=1) or to deliver signal S16CK when read mode is activated (TEN=0 and READEN_n=0).

Control unit 47 further includes a bistable trigger circuit D 471 associated with a set of logic gates 470 to deliver, in particular, the aforementioned signals TEN, QEOT and QCLOSELOCK_n as well as two other bistable trigger circuits D 472 and 473 associated with a second set of logic gates 475 to deliver, in particular, signal ENREAD_n.

Write key activation signal CLOSELOCK_n delivered by unit 45 of FIG. 9 is applied to input D of bistable trigger circuit 471. The latter is clocked by activation signal CK4BITS and includes an inverted activation terminal (SET) connected to the inverse RESET_n of the initialisation signal. The inverted output of bistable trigger circuit 471 delivers signal QCLOSELOCK_n.

The set of logic gates 470 includes a first AND gate with two inputs whose output is connected to a first NOR gate with two inputs, the other input of this NOR gate receiving signal EOT. The output of this NOR gate is applied, via an inverter (signal QEOT) to an input terminal of the first AND gate, the other input of this AND gate receiving the inverse RESET_n of the initialisation signal. The output of the inverter (QEOT) is also connected to an input terminal of a second NOR gate with three inputs whose output delivers signal TEN. A second input of this NOR gate with three inputs receives a signal QNREAD originating from the inverted output of bistable trigger circuit D 472. The third input of the NOR gate originates from the output of a second AND gate with two inputs connected respectively to the non inverted output QCLOSELOCK of bistable trigger circuit D 471 and the output of logic circuit 456 delivering activation signal CK4BITS.

Read key activation signal READ_n delivered by unit 45 of FIG. 9 is applied to input D of bistable trigger circuit 472. The latter is also clocked by activation signal CK4BITS and includes an inverted activation terminal (SET) connected to the inverse RESET_n of the initialisation signal. The inverted output of bistable trigger circuit 472 delivers signal QNREAD. The non inverted output QREAD of this bistable trigger circuit 472 is connected to input D of bistable trigger circuit 473 clocked by a clock signal CKENREAD originating from the NOR logic combination of signal DATAQ originating from the aforementioned bistable trigger circuit D 460 and the inverse of clock signal CKDATA_OUT. It will have been understood that this clock signal CKENREAD is inactive during data loading in shift register 43 (DATAQ=1) and corresponds to signal CKDATA_OUT in the opposite case (DATAQ=0).

The set of logic gates 75 is substantially similar to set 470 and includes a first AND gate with two inputs whose output is connected to a first NOR gate with two inputs, the other input of this NOR gate receiving signal EOTREAD. The output of this NOR gate is applied, via an inverter, (signal QEOTR) to an input terminal of the first AND gate, the other input of this AND gate receiving the inverse RESET_n of the initialisation signal. The inverted output (QEOTR) is also connected to an input terminal of an NXOR gate with two inputs whose output delivers signal ENREAD_n. The second input of this NXOR gate receives the signal originating from the inverted output of bistable trigger circuit D 473.

Finally, it will be noted that signal EOTRANSMIT transmitted to generator circuit 80 of signals TIMEOUT_n and STARTUP (FIGS. 3 and 5) is produced at the output of a NAND gate including two inputs respectively connected to the inverses of signals QEOT and QEOTR of logic gate sets 470 and 475.

Upon reading FIG. 11 and the indications hereinbefore, those skilled in the art will easily understand how the various elements presented interact without it being necessary to dwell any longer on this fact. It will simply be noted, according to the arrangement illustrated, that the non-inverted outputs of the two bistable trigger circuits D 471 and 472 are both at the high logic level while the system is in initialisation mode (RESET=1) or while none of the write or read keys has been loaded. In this state, the inverted output of bistable trigger circuit D 473 is likewise at the low logic state.

During initialisation (RESET=1), the end-of-transmission signals EOT (end of loading the thirteen data bits in write mode) and EOTREAD (end of generating output signal DATA_OUT in read mode) are at the low logic state. Signals QEOT and QEOTR delivered respectively by logic gate sets 470 and 475 are also at the low logic state. Taking account of the fact that activation signal CK4BITS and the inverted output QNREAD of bistable trigger circuit D 472 are also both at the low logic level, signal TEN produced by logic gate set 470 is brought to the high logic level. Likewise, taking account of the fact that the inverted output of bistable trigger circuit D 473 as well as signal QEOTR are both at the low logic level, the output of the NXOR gate delivering signal READEN_n is also brought to the high logic level.

As soon as the initialisation signal is brought to the low logic level (RESET=0), signals QEOT and QEOTR are held at their initial low logic level, signals TEN and READEN_n keeping their high logic level. The two selection stages 451 and 452 are thus respectively controlled so as to select data signal DATA, on the one hand, and clocking signal SCK on the other hand.

As soon as the programming mode is activated (PROG_EN=1) and data DATA are introduced in accordance with the aforementioned diagram, elements 460, 461, 462, 463 and 465 are activated to produce clocking signals SCK, S4CK_n, S12CK_n and S16CK in synchronism with the leading edge of each data bit introduced. The first data bits, in this case key bits K[3] to K[0], are thus transmitted and loaded in shift register 43 (FIG. 9) and counter 455 counts the pulses of clocking signal SCK generated for loading bits in the shift register.

As soon as four pulses of signal SCK have been detected, activation signal CK4BITS passes to the high logic level, activating bistable trigger circuit D 471 and 472. If the key bits K[3] to K[0] do not correspond to any of the defined read and write keys, bistable trigger circuits D 471 and 472 keep their state, i.e. QCLOSELOCK and QREAD at the high logic level. In this situation, the passage to the high logic level of activation signal CK4BITS causes the closure of the second NOR logic gate (with three inputs) of set 470 and the passage of control signal TEN to the low logic level thus blocking any subsequent transmission of data and any loading of data in shift register 43.

If the read key is correctly introduced (READ_n=0), this causes the passage of signal QREAD to the low logic level and of its inverse QNREAD to the high logic level, and, as a result, the passage of control signal TEN to the low logic level. The subsequent introduction of data in the shift register is thus also interrupted (DATA=0).

As soon as the non inverted output signal DATAQ of bistable trigger circuit D 460 again passes to the low logic level following initialisation of the latter via initialisation signal EOB, clock signal CKDATA_OUT is then applied to the clock input CKENREAD of bistable trigger circuit D 473 causing the passage of its inverted output to the high logic level and, consequently, the passage of signal ENREAD_n to the low logic level at the output of the NXOR gate of set 475.

The passage of signal ENREAD_n to the low logic level causes the switching of the two selection stages 451 and 452 on the clock signals CKDATA_OUT and S16CK respectively. The read process of the stored data is then undertaken in accordance with the diagram already described with reference to FIG. 12 until the moment at which the end of read signal EOTREAD passes to the high logic level at the end of the transmission of the eighth data bit EED[7]. This passage also causes the switching, in logic gate set 475, of signal QEOTR to the high logic level and, consequently, the return of signal ENREAD_n to the high logic level at the output of the NXOR gate.

In the event that the key introduced corresponds to the write key (CLOSELOCK_n=0), this causes the passage of signal QCLOSELOCK to the low logic level, ensuring that signal TEN is kept at the high logic level. The introduction of the remaining data bits (bits D[7] to D[0] and parity bit P) can thus continue. At the end of loading the thirteen data bits, detected after counter 455 has counted the thirteen pulses of signal SCK, the end of data introduction signal EOT passes to the high logic level, thus also causing, in logic gate set 470, the passage of signal QEOT to the high logic level and the passage of control signal TEN to the low logic level. The data entry is thus again interrupted upstream of shift register 43 (DATA=0).

With reference again to FIG. 9, if the parity of the data is verified (ENPARITY=1), the passage of signals QEOT and CLOSELOCK_n to the high logic level combined with states QOE2=1, QOE1_n=1 (cf. above), TIMEOUT_n=1 and the pulses of clock signal CK, causes signal EEPROG_ST to pass briefly (for the duration of a pulse of clock signal CK) to the high logic state, starting the write process of the data bits introduced D[7] to D[0] into the EEPROM memory.

Although the invention has been described within the scope of a preferred application, i.e. to adjusting a feature of an oscillating circuit, it will be noted that the programming principle that has just been described is also applicable to other electronic devices, such as integrated sensors, having a feature that one would like to adjust. It will also be noted that although the feature adjusted in the example described is a capacitance value, the adjustment can be carried out on other elements of the oscillator circuit, such as the value of a resistive element or adjusting the division rate of a frequency divider circuit. Nonetheless the oscillator circuit presented as an embodiment of the invention itself constitutes a very advantageous solution.

It will also be understood that various modifications and/or improvements obvious to those skilled in the art can be made to the embodiment described in the present description without departing from the scope of the invention defined by the annexed claims. Thus, numerous alternative logical solutions are available to those skilled in the art to make the write and programming functions described. The invention thus should not be limited to the strict configuration of the logic circuits presented in the Figures.

What is claimed is:

1. An electronic device including an electronic circuit for delivering an output signal and a programmable non volatile memory coupled to said electronic circuit to allow storage of a binary word representative of at least one adjustable feature of said electronic circuit, this electronic device including at least first and second supply terminals to which first and second supply potentials are applied, and at least one output terminal at which said output signal from the electronic circuit is delivered, wherein the electronic device further includes:

an output stage coupled to said electronic circuit and to said output terminal to set the latter in a first state, called the normal state, in which said output signal from the electronic circuit is delivered by said output terminal, or in a second state, called the high impedance state, in which said output signal from the electronic circuit is not delivered by said output terminal and in which said output terminal has a high output impedance;

a control terminal and detection means coupled to said output stage and to said control terminal to detect the application of a determined control signal at the control terminal and, in response, to set said output terminal in said high impedance state;

a serial communication interface including at least one data introduction terminal connected to said output terminal to receive, in serial form, data bits transmitted via said output terminal when the latter is in said high impedance state; and control means connected to said serial communication interface and to said non-volatile memory for storing said transmitted data bits in said non-volatile memory.

2. The device according to claim 1, wherein said serial communication interface further includes a data extraction terminal for delivering, in serial form, data bits representative of said binary word stored in said non volatile memory.

3. The device according to claim 1, wherein said serial communication interface further includes means for detecting a key transmitted via said output terminal.

4. The device according to claim 1, further including means for returning said output terminal to its first so-called normal state at the end of a determined interval of time.

5. The device according to claim 1, wherein said electronic circuit is an oscillator circuit delivering an oscillation signal at a determined frequency and wherein said adjustable feature of the device is a feature of said oscillator circuit.

6. The device according to claim 5, wherein said oscillator circuit is an inverter type oscillator circuit including first and second load capacitors arranged at the input and output of said oscillator circuit, and wherein the adjustable feature is the capacitance value of at least one of said first and second load capacitors.

7. The device according to claim 6, wherein at least one of said load capacitors is formed of a network of a plurality of capacitors each able to be connected in parallel by means of a switch controlled by the state of a corresponding bit of said binary word.

8. The device according to claim 5, wherein said serial communication interface further includes a data extraction terminal for delivering, in serial form, data bits representative of said binary word stored in the non volatile memory, and wherein said device further includes a selection stage connected to the output of said oscillator circuit and to said data extraction terminal of said serial communication interface to deliver either said oscillation signal or said data bits representative of said binary word stored in the non-volatile memory by said output terminal.

9. The device according to claim 1, wherein said detection means are arranged to detect the application of a determined control signal substantially equal to half the supply voltage of the electronic device.

10. A method for programming and/or reading a programmable non volatile memory of an electronic device including an electronic circuit for delivering an output signal, said programmable non volatile memory being designed to allow storage of a binary word representative of at least one adjustable feature of said electronic circuit, this electronic device including at least first and second supply terminals to which first and second supply potentials are applied, and at least one output terminal at which said output signal of the electronic circuit is delivered, wherein this method includes the following steps:

switching said output terminal into a so-called high impedance state in which said output signal of the electronic circuit is not delivered by said output terminal and in which this output terminal has a high output impedance;

introducing in serial form via said output terminal data bits; and storing in said non volatile memory at least a part of said introduced data bits and/or reading at least a part of said binary word stored in said non volatile memory.

11. The method according to claim 10, wherein the switching of said output terminal into said high impedance state is carried out by applying a determined potential to a control terminal of said electronic device.

12. The method according to claim 10, wherein said data bit introduction step includes the prior introduction of a key and wherein said storing or reading step is only carried out if said key corresponds to a predetermined write key or read key.

* * * * *